United States Patent
Yoshinaga

(10) Patent No.: US 8,022,399 B2
(45) Date of Patent: Sep. 20, 2011

(54) ORGANIC LIGHT-EMITTING DEVICE

(75) Inventor: Hideki Yoshinaga, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 187 days.

(21) Appl. No.: 12/439,774

(22) PCT Filed: Sep. 10, 2007

(86) PCT No.: PCT/JP2007/068011
§ 371 (c)(1),
(2), (4) Date: Mar. 3, 2009

(87) PCT Pub. No.: WO2008/032845
PCT Pub. Date: Mar. 20, 2008

(65) Prior Publication Data
US 2010/0078627 A1    Apr. 1, 2010

(30) Foreign Application Priority Data

Sep. 14, 2006  (JP) .................. 2006-249129
Aug. 27, 2007  (JP) .................. 2007-219270

(51) Int. Cl.
*H01L 29/08* (2006.01)
(52) U.S. Cl. .................. 257/40; 257/E51.018
(58) Field of Classification Search .................. 257/40, 257/E51.018
See application file for complete search history.

(56) References Cited

U.S. PATENT DOCUMENTS

2001/0054867 A1    12/2001  Kubota .................. 313/504

FOREIGN PATENT DOCUMENTS

| JP | 10-233283 | 9/1998 |
|----|-----------|--------|
| JP | 2000-003792 | 1/2000 |
| JP | 2002-134271 | 5/2002 |
| JP | 2005-203196 | 7/2005 |
| JP | 2006-236744 | 9/2006 |

*Primary Examiner* — Matthew Reames
(74) *Attorney, Agent, or Firm* — Fitzpatrick, Cella, Harper & Scinto

(57) ABSTRACT

The organic light-emitting device of the present invention includes: a substrate; a plurality of organic light-emitting elements formed on the substrate; and an element isolation layer formed between the plurality of organic light-emitting elements, each of the elements having: on the substrate in mentioned order, a first electrode patterned for each of the organic light-emitting elements, an organic compound layer patterned for each of the organic light-emitting elements, and a second electrode; the element isolation layer formed across a space between the plurality of first electrodes to cover the ends of the first electrodes, and having an opening at a portion corresponding to the organic light-emitting elements, and at least a portion of the element isolation layer in contact with the organic compound layer is formed of an inorganic material.

1 Claim, 4 Drawing Sheets

ORGANIC LIGHT-EMITTING DEVICE

TECHNICAL FIELD

The present invention relates to an organic light-emitting device for use in, for example, a flat panel display.

BACKGROUND ART

In recent years, an organic light-emitting device provided with a plurality of organic light-emitting elements (organic EL elements) which are self-luminous type display elements has been attracting attention as a flat panel display.

An organic light-emitting element has such a structure that an organic light-emitting layer (organic compound layer) is interposed between two electrodes, and a transparent electrode made of, for example, indium tin oxide (ITO) is used for one of the electrodes in order that light emitted from the organic light-emitting layer may be extracted to the outside of a panel of the organic light-emitting device. The organic light-emitting element is typically formed on a substrate made of, for example, glass.

Further, the outer peripheral surface of the organic light-emitting element is sealed with a sealing material, and the element emits light as a result of the application of a voltage by an external driver circuit.

Since an organic light-emitting element is a self-luminous type display element, the element does not require any backlight, can be reduced in thickness, and has good visibility and a wide color reproduction range. In view of the foregoing, a plurality of corporations has been conducting research and development of organic light-emitting elements with a view to commercializing the elements.

At present, an organic light-emitting element has been already put into practical use as a display element for displays such as of an on-vehicle component and a mobile phone.

By the way, an organic light-emitting element which has the above characteristics is known to be extremely vulnerable to moisture in general.

For example, when moisture infiltrates into an organic light-emitting element, a non-light-emitting region referred to as a dark spot is generated, with the result that a problem concerning the lifetime of the element such as inability to maintain a light-emitting state occurs.

The following proposal has been conventionally made as a measure to solve the problem of the lifetime.

Flat glass is used as a sealing member for an organic light-emitting element substrate on which the organic light-emitting element is mounted, and a space between the organic light-emitting element substrate and the flat glass is filled with an inert gas. After that, the organic light-emitting element substrate is sealed with the flat glass by bonding the organic light-emitting element substrate and the flat glass with a UV curing resin of cation curing type (see Japanese Patent No. 3288242).

Another approach involving sealing the organic light-emitting element with a stacked structure having a barrier property has also been known (see Japanese Patent Application Laid-Open No. 2002-134271).

However, even when the organic light-emitting element substrate is sealed with the flat glass as a sealing member by using a UV curable adhesive of cation curing type as described in Japanese Patent No. 3288242, the infiltration of moisture from the resin portion as the adhesive or the infiltration of moisture from an interface at which the element is sealed with the flat glass cannot be completely prevented. As a result, considering the operating time of the element in practical use, the following problem exists: a dark spot is gradually generated, or a dark spot region gradually expands so that the element does not emit light.

Another approach involving interposing a moisture adsorbing member described in Japanese Patent No. 3288242 in order to adsorb moisture infiltrating into an organic light-emitting device in the above sealed structure is also known. However, when a sheet-shaped moisture adsorbing member is used, it is difficult to select flat glass as a sealing member because the sheet-shaped moisture adsorbing member has a thickness of, for example, about 250 µm.

Meanwhile, it is possible to adopt the so-called cap type glass which is dug down except the region where the organic light-emitting element substrate and flat glass are bonded to each other in order that a moisture absorbing member may be interposed, or a structure in which a spacer is provided between the organic light-emitting element substrate and the flat glass. However, such structures lead to cost increase or larger thickness of an organic light-emitting device.

The use of a stacked structure having barrier property is also considered as described in Japanese Patent Application Laid-Open No. 2002-134271 as another sealing approach. In the approach, since a moisture barrier film is directly formed on an organic light-emitting element, the barrier film may have a defect owing to, for example, an influence of a contaminant (an impurity or foreign matter) or a pinhole. In that case, moisture infiltrates into the organic light-emitting element through the defect to inhibit the light emission of the organic light-emitting element, with the result that the element becomes a non-light-emitting element. Further, moisture propagates from the non-light-emitting element into an organic light-emitting element adjacent to the non-light-emitting element to turn the adjacent organic light-emitting elements into non-light-emitting elements one after another. As a result, a wide range of an organic light-emitting device deteriorates, and hence the yield of the device is remarkably reduced. The inventor of the present invention has discovered that layers which mainly propagate moisture in this case are an element isolation layer formed between two adjacent organic light-emitting elements, an organic compound layer forming an organic light-emitting element, or a planarizing layer for covering an upper portion of a thin-film transistor (TFT) to planarize the covered surface thereof.

DISCLOSURE OF THE INVENTION

The present invention provides an organic light-emitting device capable of suppressing a reduction in yield thereof by minimizing the expansion of the deterioration of the device characteristics due to the propagation of moisture in an in-plane direction of the device.

The present invention adopts, as a measure for solving the above-mentioned problems of the prior art, a constitution in which an organic compound layer for forming organic light-emitting elements is independently formed for each of the elements so as not to be brought into contact with an organic layer formed around the layer such as a planarizing layer or an element isolation layer.

To be specific, according to the first aspect of the present invention, an organic light-emitting device includes:

a substrate; a plurality of organic light-emitting elements formed on the substrate; and an element isolation layer formed between the plurality of organic light-emitting elements, wherein each of the organic light-emitting elements includes, on the substrate in mentioned order, a first electrode patterned for each of the organic light-emitting elements, an organic compound layer patterned for each of the organic light-emitting elements, and a second electrode in the stated order, wherein the element isolation layer is formed across a space between the plurality of first electrodes to cover the ends of the first electrodes, and having an opening at a portion of each of the organic light-emitting elements, and wherein at least a portion of the element isolation layer in contact with the organic compound layer is formed of an inorganic material.

In addition, according to the second aspect of the present invention, an organic light-emitting device includes:

a substrate; a plurality of organic light-emitting elements each formed on the substrate to form a light-emitting surface; and an element isolation layer formed between the plurality of organic light-emitting elements, wherein each of the organic light-emitting elements includes, on the substrate in mentioned order, a first electrode extending in one direction in the light-emitting surface across a space between the plurality of organic light-emitting elements and provided so as to be common to the plurality of organic light-emitting elements arranged in the one direction, an organic compound layer patterned for each of the organic light-emitting elements, and a second electrode provided so as to be common to the plurality of organic light-emitting elements arranged in another direction intersecting in the one direction across the space between the plurality of organic light-emitting elements, wherein the element isolation layer is formed across a space between the adjacent first electrodes to cover the ends of the first electrodes, and wherein at least a portion of the element isolation layer in contact with the organic compound layer is formed of an inorganic material.

According to the present invention, moisture infiltrating from a defective portion in an inorganic sealing layer does not propagate into an adjacent organic light-emitting element through an organic compound layer for forming an organic light-emitting element. In addition, moisture in a planarizing layer does not propagate into an organic compound layer (organic EL layer) through an element isolation layer. As a result, the yield of an organic light-emitting device can be improved.

Other features and advantages of the present invention will be apparent from the following description taken in conjunction with the accompanying drawings, in which like reference characters designate the same or similar parts throughout the figures thereof.

BEST MODE FOR CARRYING OUT THE INVENTION

Preferred embodiments of the present invention will now be described in detail in accordance with the accompanying drawings.

Embodiment 1

A first embodiment of an organic light-emitting device according to the present invention will be described.

The organic light-emitting device of this embodiment is an active matrix type organic light-emitting device in which a TFT for driving each organic light-emitting element is formed on a substrate.

The organic light-emitting device of this embodiment includes: a substrate; a plurality of organic light-emitting elements formed on the substrate; and an element isolation layer formed between the plurality of organic light-emitting elements. Each of the organic light-emitting elements has, on the substrate in mentioned order, a first electrode patterned for each of the organic light-emitting elements, an organic compound layer patterned for each of the organic light-emitting elements, and a second electrode. The element isolation layer is formed across a space between the plurality of first electrodes to cover the ends of the first electrodes, and has an opening at a portion of each of the organic light-emitting elements. In addition, since the organic light-emitting device of this embodiment is an active matrix type organic light-emitting device, the device has, on the substrate, a plurality of thin-film transistors for controlling the light emission of the plurality of organic light-emitting elements, and a planarizing layer formed on each of the thin-film transistors. In addition, the device is characterized in that at least a portion of the element isolation layer in contact with the organic compound layer is formed of an inorganic material.

Such constitution can prevent the propagation of moisture into adjacent organic light-emitting elements through an organic compound layer for forming an organic light-emitting element or an element isolation layer.

Hereinafter, the present invention will be described more specifically with reference to the drawings.

Figure 1A:
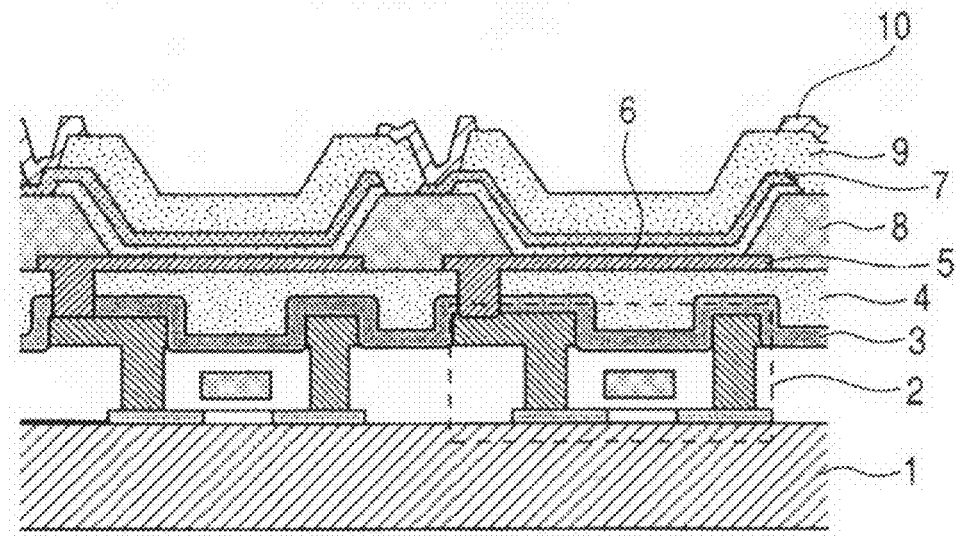
FIGS. 1A and 1B are schematic views illustrating a portion where a second electrode and a connection electrode for the second electrode are connected to each other, taken in the line 1A-1A of FIG. 2, and a region other than the portion, taken in the line 1B-1B of FIG. 2, respectively, according to Embodiment 1 of the present invention.
Figure 1B:
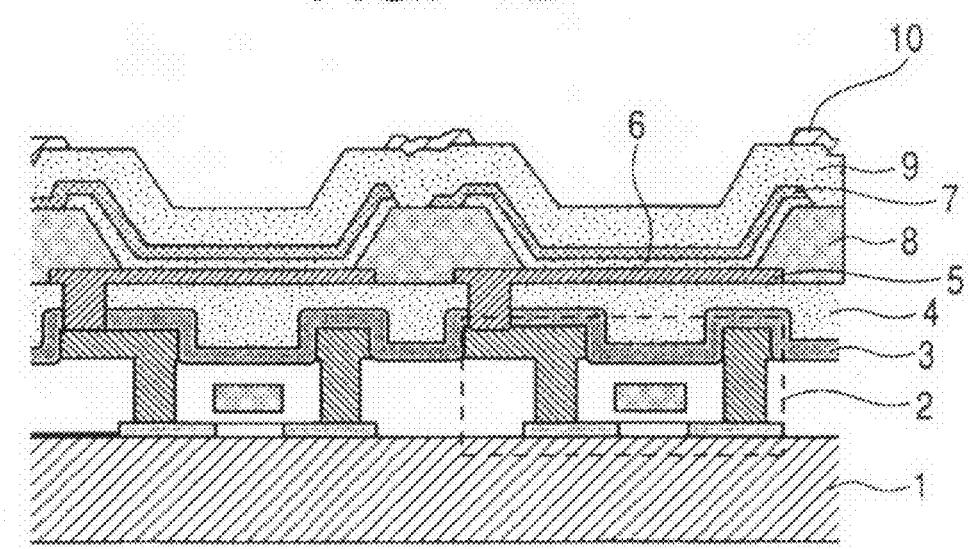

FIG. 1A is a schematically sectional view illustrating a portion where the second electrode of an organic light-emitting device according to Embodiment 1 of the present invention and a connection electrode for the second electrode are connected to each other, and FIG. 1B is a schematically sectional view illustrating a region except the portion where the second electrode of the organic light-emitting device according to Embodiment 1 of the present invention and the connection electrode for the second electrode are connected to each other. In addition, FIG. 2 is a schematically top view of the organic light-emitting device according to Embodiment 1 of the present invention.

Figure 2:
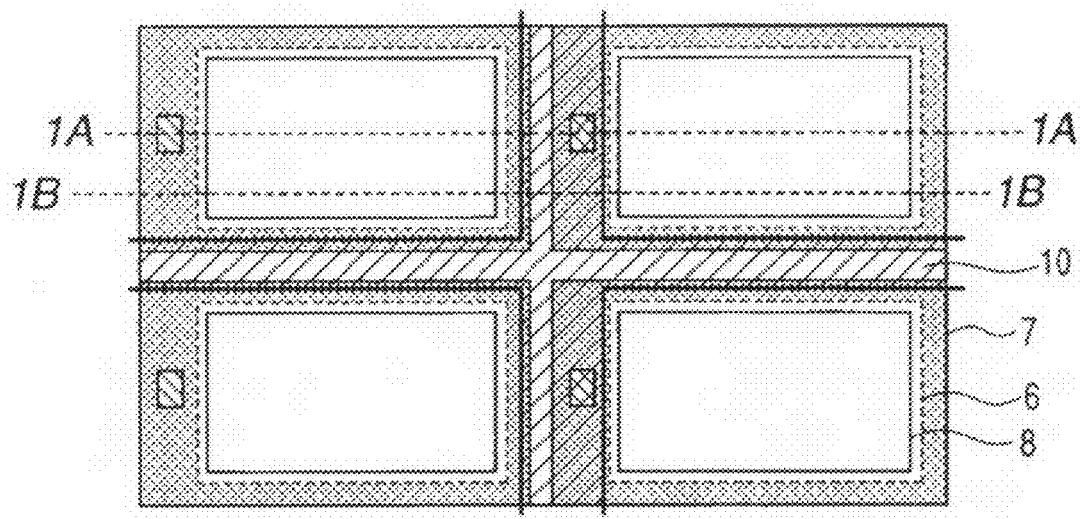
FIG. 2 is a schematically perspective top view of an organic light-emitting device according to Embodiment 1 of the present invention.

FIG. 1A and FIG. 1B are schematically sectional views taken in the lines 1A-1A and 1B-1B of FIG. 2, respectively.

The organic light-emitting device of this embodiment has a thin-film transistor (TFT) 2, an insulating layer 3, a planarizing layer 4, a first electrode (anode) 5, an organic compound layer (organic EL layer) 6, a second electrode (cathode) 7, an element isolation layer 8, an inorganic sealing layer 9, and a connection electrode 10 for the second electrode, which are formed on a glass substrate 1 (see FIGS. 1A and 1B). The organic light-emitting device is characterized in that at least the surface (top surface in this embodiment) of the element isolation layer 8 opposite to the glass substrate 1 is formed of an inorganic material. Further, the device is characterized in that the organic compound layer 6 is separated between adjacent organic light-emitting elements (see FIG. 2). As a result, moisture in the planarizing layer 4 does not propagate into the organic compound layers 6 through the element isolation layer 8. In addition, moisture infiltrating from a defective portion of the inorganic sealing layer 9 does not propagate into an adjacent organic light-emitting element through the organic compound layer 6. As a result, the yield of the organic light-emitting device can be improved.

Hereinafter, the constitution of the above organic light-emitting device will be described more specifically in accordance with a production method.

The TFT 2 is formed on the glass substrate 1, and, furthermore, the insulating layer 3 is formed in order to protect the TFT 2, though detailed description of the formation of each of the TFT 2 and the insulating layer 3 is omitted because the formation is not the essence of the present invention.

The planarizing layer 4 formed of an organic material (a resin such as acryl or polyimide) is formed in order to planarize the irregularities of a TFT backplane obtained in the above step.

A contact hole is formed in the insulating layer 3 and the planarizing layer 4 for electrical contact with each drain terminal formed in the TFT backplane. After that, a Cr film having a thickness of 100 nm is formed. After that, the first electrode 5 is formed by using a wet process.

After the formation of the first electrode 5, an SiN film having a thickness of 500 nm is formed thereon by employing plasma CVD, and is subjected to a dry etching treatment, whereby the element isolation layer 8 is formed. The element isolation layer 8 here was entirely formed of an inorganic sealing material by using an SiN film, but after the formation of an isolation film shape from an organic sealing material such as acryl, an SiN film having a thickness of about 100 nm may be formed thereon. In this case, the dry etching time for the SiN film can be shortened.

The substrate that has undergone the above steps is subjected to UV/ozone cleaning. After that, the substrate is vacuum-baked in a vacuum degree of $1 \times 10^{-2}$ Pa at a temperature of 50° C. for 7 hours. Then, the substrate is transferred to an organic EL vapor deposition apparatus. The apparatus is evacuated to a vacuum, and an RF power of 50 W is input to a ring-shaped electrode provided in the pretreatment chamber of the apparatus where the substrate is subjected to an oxygen plasma cleaning treatment. The treatment is performed under an oxygen pressure of 0.6 Pa for a time period of 40 seconds.

The substrate is conveyed from the pretreatment chamber to the film formation chamber of the apparatus, and the film formation chamber is evacuated to a vacuum degree of $1 \times 10^{-4}$ Pa. After that, αNPD having hole transportability is formed into a film having a thickness of 35 nm by a resistance heating deposition method, whereby a hole transport layer is formed. The film is formed at a rate of 0.2 nm/sec. It should be noted that the hole transport layer is vapor-deposited with a lattice metal mask in order to be vapor-deposited on all organic light-emitting elements (pixels).

Alq3 as an alkylate complex is formed into a film having a thickness of 15 nm on the hole transport layer by a resistance heating deposition method under the same film formation conditions as those of the hole transport layer, whereby a light-emitting layer is formed. It should be noted that the light-emitting layer is vapor-deposited with a lattice metal mask in order to be vapor-deposited on all organic light-emitting elements as in the case of the hole transport layer because there is no need to separately provide light-emitting layers for red (R), green (G) and blue (B) colors in this case. The light-emitting layers for R, G and B colors can be provided by forming light-emitting layers for the respective colors with a metal mask corresponding to an emission array of R, G and B colors.

An electron injection layer having a thickness of 35 nm is formed on the light-emitting layer with a resistance heating co-deposition method by mixing Alq3 and cesium carbonate ($Cs_2CO_3$) at a thickness ratio of 9:1 and adjusting the deposition rate of each of Alq3 and cesium carbonate in order that the mixture may be vapor-deposited at a rate of 0.3 nm/sec.

The substrate is conveyed to the sputtering chamber of the apparatus for the formation of an electrode in order to form the second electrode 7. The second electrode 7 having a thickness of 130 nm as a light transmissive member is formed on the electron injection layer by a DC magnetron sputtering method using an ITO target and a metal mask. As a result, the second electrode 7 is dividedly formed for each organic light-emitting element with the metal mask. Light emitted from the light-emitting layer transmits through the second electrode and is extracted to the outside of the device because the second electrode is a light transmissive member.

The conditions under which the second electrode is formed are as follows: the electrode is formed at room temperature without the heating of the substrate under a pressure of 1.0 Pa by using Ar, $H_2O$ and $O_2$ gases at flow rates of 500 sccm, 1.5 sccm and 5.0 sccm, respectively, while an input power to be applied to the target is set to 500 W for ITO. The second electrode has a transmittance of 85% (at 450 nm) and a specific resistance of $8 \times 10^{-4}$ Ω·cm.

The above constitution is such that the second electrode 7 is separated between adjacent organic light-emitting elements; in the present invention, the second electrode 7 does not necessarily need to be separated between adjacent organic light-emitting elements, and a constitution in which the second electrode is formed across a space between the organic light-emitting elements so as to be common to the elements is also permitted. The reason why the latter constitution is permitted is as follows: the propagation of moisture into an adjacent organic light-emitting element as a result of the transmission of moisture through the second electrode does not become a serious problem because the rate at which moisture permeates through the second electrode is extremely slow as compared to the rate at which moisture permeates through an organic layer. It should be noted that a constitution in which the second electrode 7 is separated between adjacent organic light-emitting elements is a more preferable constitution because the constitution can prevent, for example, a slight amount of moisture from propagating into an adjacent organic light-emitting element through the second electrode 7.

As described above, after the formation of the TFT backplane on the glass substrate 1, the first electrode 5; the hole transport layer, the light-emitting layer and the electron injection layer as the organic compound layer 6; and the second electrode 7 are formed, whereby an organic light-emitting element substrate is produced.

In order to prevent a large amount of moisture in the air from infiltrating into the organic light-emitting device, an Si target is subjected to reactive DC sputtering, whereby the inorganic sealing layer 9 having a thickness of 200 nm is formed. In this embodiment, the inorganic sealing layer 9 is a light transmissive member as in the case of the second electrode because light is extracted from the side of the second electrode; when light is extracted from a substrate side, the inorganic sealing layer may be a member made of, for example, a metal instead of a light transmissive member. The inorganic sealing layer 9 and the element isolation layer 8 are formed so as to be in contact with each other on the same organic light-emitting element 8 because the second electrode 7 is formed so as to be separated by a space between adjacent organic light-emitting elements (see FIGS. 1A and 1B). It should be noted that the above process for forming the inorganic sealing layer is performed by using Ar and $N_2$ gases at a flow rate ratio Ar:$N_2$ of 2:1 under a pressure of 0.2 Pa with an input power of 6.5 W/cm$^2$.

A contact hole is formed in the inorganic sealing layer 9 by a dry etching method in order that the second electrodes 7 divided for each organic light-emitting element may be electrically controlled to a common electric potential (see FIG. 1A).

Subsequently, a Cr film having a thickness of 500 nm is formed through the contact hole formed in the inorganic sealing layer 9 for electrical contact with each of the second electrodes 7. After that, the connection electrode 10 for the second electrode is formed into a lattice shape by using a wet process (see FIG. 2). In this case, the connection electrode 10 is formed on the element isolation layer 8 so as to avoid a display region.

It should be noted that an electrode material to be used is not limited to Cr. In addition, the connection electrode 10, which is formed into a lattice (matrix) shape in this case, may also be formed into, for example, a roller screen (stripe) shape. In other words, as far as the connection electrode 10 can be in electrical contact with each of the second electrodes, any shape of the connection electrode 10 can be selected depending on the electrical resistance of an electrode material for the connection electrode 10 and the thickness of the connection electrode 10.

Element Evaluation 1

After the light emission state of the organic light-emitting device immediately after the production of the organic light-emitting device had been observed, the device was subjected to a durability test under a 60° C./90% RH atmosphere for 1,000 hours in order to verify the long-term reliability of the device. As a result, the following was confirmed: a portion of the SiN film as the inorganic sealing layer 9 was observed to crack owing to an influence of a contaminant, but a region undergoing a pixel defect due to the infiltration of moisture did not expand into a size larger than that of a pixel region where the SiN film cracked. On the other hand, the following was confirmed: in an organic light-emitting device produced by a conventional production method, a cracked portion in an SiN film as a sealing layer expanded into a defective region having a diameter of about 20 mm around the cracked portion.

Embodiment 2

A second embodiment of the organic light-emitting device according to the present invention will be described.

Figure 3:
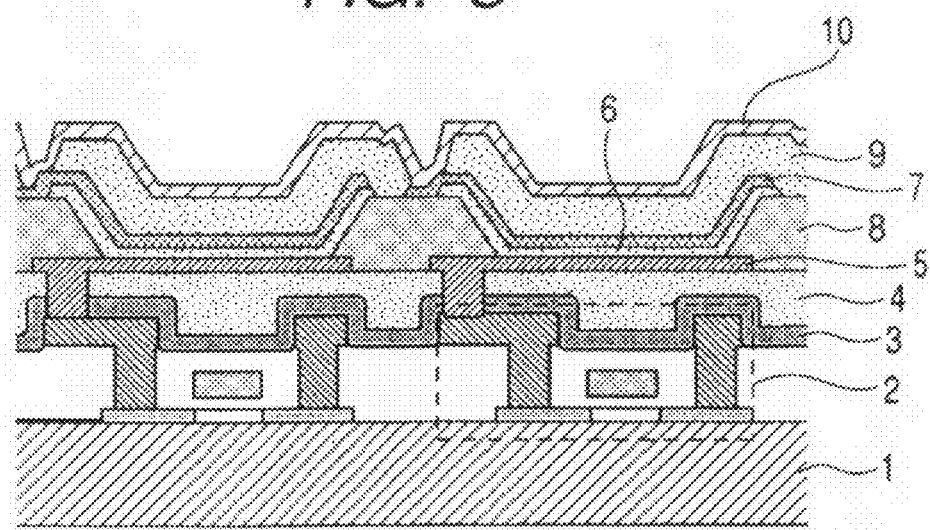
FIG. 3 is a schematically sectional view of an organic light-emitting device according to Embodiment 2 of the present invention.

The organic light-emitting device of this embodiment has the constitution as that of the organic light-emitting device of the above-mentioned first embodiment, except that the connection electrode 10 for the second electrode is formed of a light transmissive member continuously formed across a space between a plurality of organic light-emitting elements (see FIG. 3). In this case, a material for the connection electrode is preferably a metal oxide conductive material such as ITO or IZO.

Element Evaluation 2

After the light emission state of the organic light-emitting device of the above-mentioned second embodiment immediately after the production of the organic light-emitting device had been observed, the device was subjected to a durability test under a 60° C./90% RH atmosphere for 1,000 hours in order to verify the long-term reliability of the device. As a result, the following was confirmed: a portion of the SiN film as the inorganic sealing layer 9 was observed to crack owing to an influence of a contaminant, but a region undergoing a pixel defect due to the infiltration of moisture did not expand into a size larger than that of a pixel region where the SiN film cracked.

Embodiment 3

A third embodiment of the organic light-emitting device according to the present invention will be described.

The organic light-emitting device of this embodiment is the so-called passive matrix type organic light-emitting device different from the above-mentioned first and second embodiments of an active matrix type organic light-emitting device.

To be more specific, the organic light-emitting device of this embodiment has a constitution in which organic compound layers are formed between stripe-shaped electrodes at a portion where the electrodes intersect each other, and the portion serves as an organic light-emitting element.

In other words, a first electrode for forming the organic light-emitting element is an electrode formed on a substrate and extending in one direction in a light-emitting surface across a space between a plurality of organic light-emitting elements. In addition, the first electrode is provided to be common to the plurality of organic light-emitting elements arranged in the one direction. In addition, a second electrode is an electrode formed on the first electrode and extending in another direction intersecting the direction in which the first electrode extends across a space between the plurality of organic light-emitting elements. In addition, the second electrode is provided to be common to the plurality of organic light-emitting elements arranged in the direction in which the second electrode extends. The organic compound layers are formed between the first electrode and the second electrode, and are patterned for each organic light-emitting element. An element isolation layer is formed across a space between the adjacent first electrodes to cover the ends of the first electrodes. In addition, at least a portion of the element isolation layer in contact with the organic compound layer is formed of an inorganic material.

Such constitution can prevent the propagation of moisture into an adjacent organic light-emitting element through an organic compound layer or an element isolation layer for forming an organic light-emitting element, as in the case of the above-mentioned active matrix type organic light-emitting device.

Figure 4A:
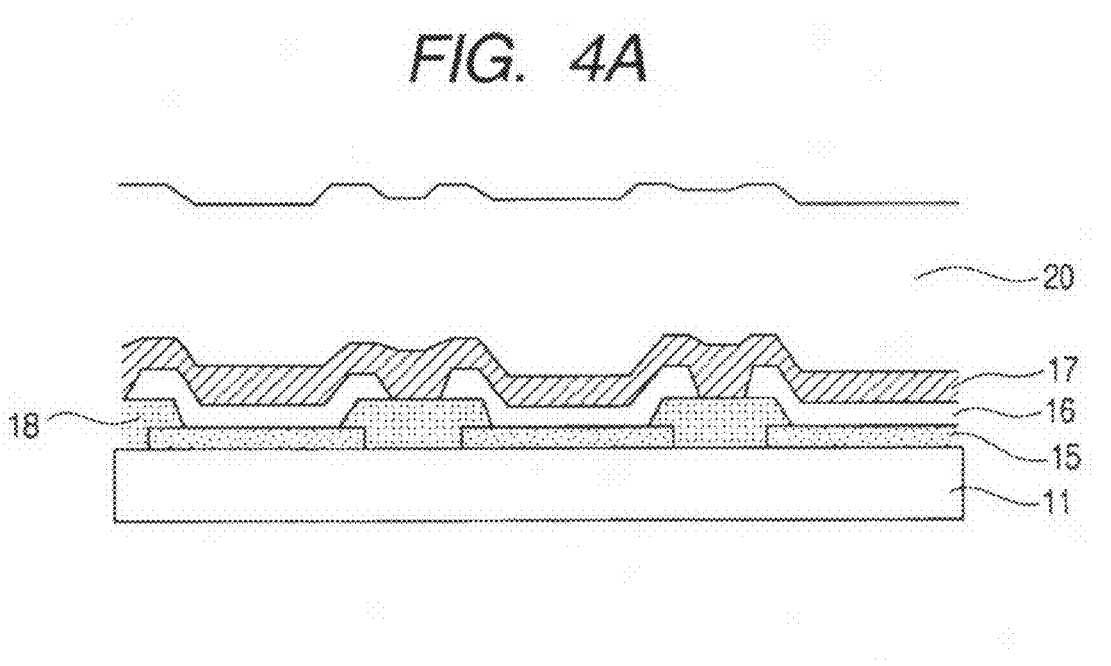
FIGS. 4A and 4B are schematically sectional views illustrating a portion where the second electrode and a connection electrode for the second electrode are connected to each other, taken in the line 4A-4A of FIG. 5, and a region other than the portion, taken in the line 4B-4B of FIG. 5, respectively, according to Embodiment 3 of the present invention.
Figure 4B:
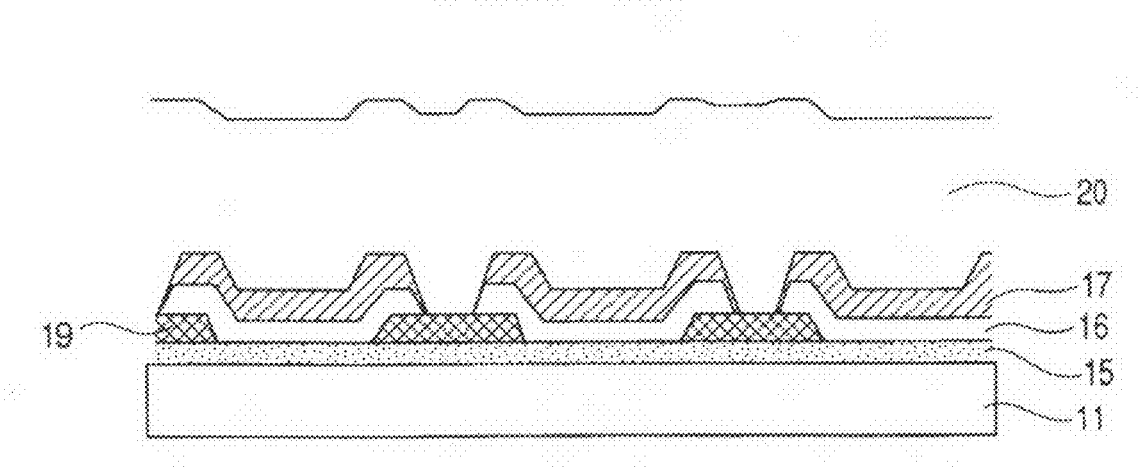
Figure 5:
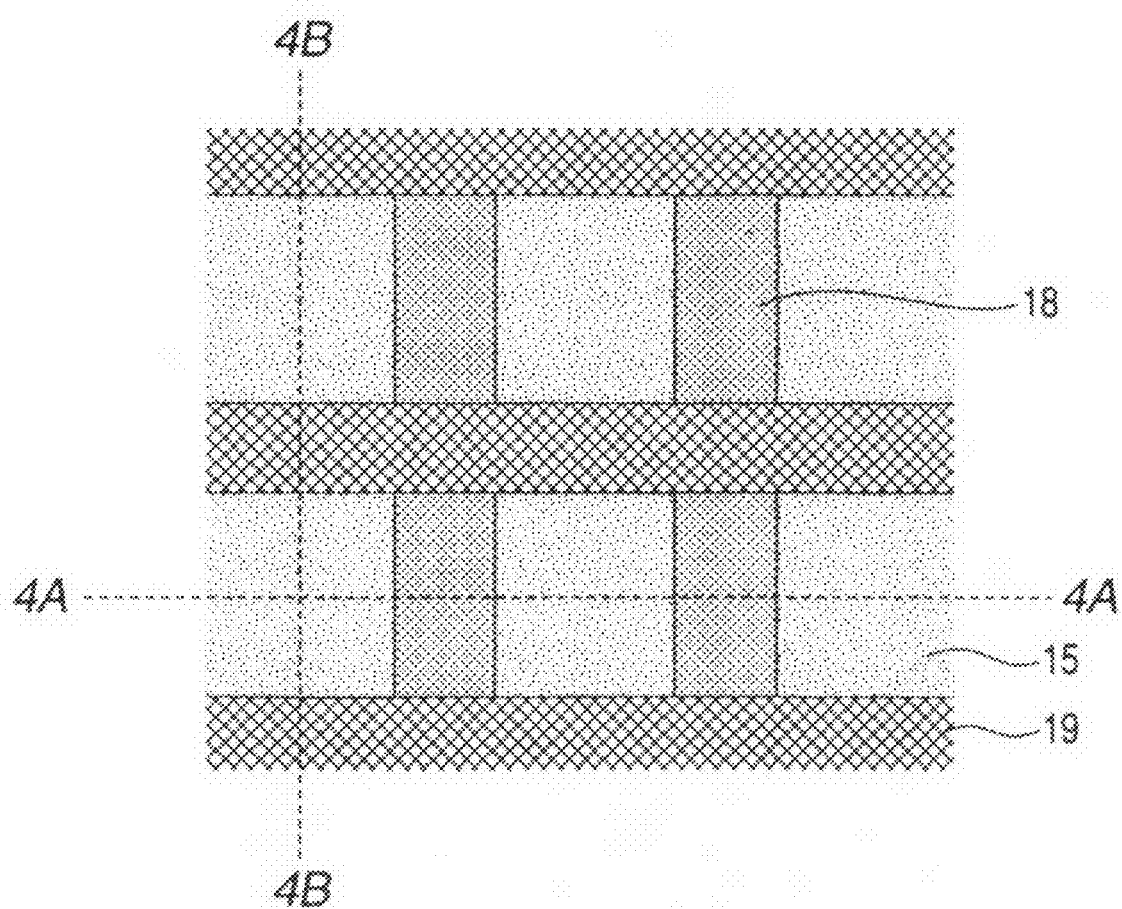
FIG. 5 is a schematic diagram of the top surface of the organic light-emitting device according to Embodiment 3 of the present invention.

FIG. 4A is a schematically sectional view of a portion where the second electrode of the organic light-emitting device according to Embodiment 3 of the present invention and a connection electrode for the second electrode are connected to each other. FIG. 4B is a schematically sectional view of a region except the portion where the second electrode of the organic light-emitting device according to Embodiment 3 of the present invention and the connection electrode for the second electrode are connected to each other. In addition, FIG. 5 is a schematically top view of the organic light-emitting device according to Embodiment 3 of the present invention. FIG. 4A and FIG. 4B are schematically sectional views taken in the lines 4A-4A and 4B-4B of FIG. 5, respectively.

The organic light-emitting device of this embodiment has a first electrode 15, an organic compound layer (organic EL layer) 16, a second electrode 17, a first element isolation layer 18, a second element isolation layer 19, and an inorganic sealing layer 20 which are formed on a substrate 11 (see FIGS. 4A and 4B). In the organic light-emitting device, at least a portion of the first element isolation layer 18 in contact with the organic compound layers is formed of an inorganic material. As a result, moisture can be prevented from infiltrating into the organic compound layers 16 through the first element isolation layer 18. In addition, at least a portion of the second element isolation layer 19 in contact with the organic compound layer is preferably formed of an inorganic material. With such constitution, moisture can be prevented from infiltrating into the organic compound layer 16 through the second element isolation layer 19. Further, the device is characterized in that the organic compound layer 16 is separated by a space between adjacent organic light-emitting elements (see FIGS. 4A and 4B). As a result, moisture infiltrating from a defective portion of the inorganic sealing layer 20 does not propagate into an adjacent organic light-emitting element through the organic compound layer 16. As a result, the yield of the organic light-emitting device can be improved.

The constitutions of the present invention have been described above. However, the present invention is not limited to the so-called top emission type organic light-emitting device as described above in which light is extracted from the side of a second electrode, but includes the so-called bottom emission type organic light-emitting device in which light is extracted from a substrate side. In addition, the present invention includes a constitution in which the first electrode is an anode and the second electrode is a cathode, though the first electrode is a cathode and the second electrode is an anode in any one of the above-mentioned embodiments.

In addition, the organic light-emitting device of the present invention can be used in a display device. The display device may be a monocolor display device in which a plurality of organic light-emitting elements for emitting a single emission color are arranged. Alternatively, the display device may be a full-color display device in which a plurality of organic light-emitting element groups each serving as a unit having organic light-emitting elements for emitting three colors, that is, red, green and blue colors are arranged.

The display device can be preferably used in, for example, a television receiver, the display portion of a PC, the display portion of a mobile phone, the display portion of a personal digital assistant (PDA), the display portion of a mobile music player, or the display portion of a car navigation system.

The present invention is not limited to the above embodiments and various changes, and modifications can be made within the spirit and scope of the present invention. Therefore to apprise the public of the scope of the present invention, the following claims are made.

This application claims priorities from Japanese Patent Applications No. 2006-249129, filed Sep. 14, 2006, and No. 2007-219270, filed Aug. 27, 2007, which are hereby incorporated by reference herein.

The invention claimed is:

1. An organic light-emitting device, comprising:
a substrate;
a plurality of organic light-emitting elements formed on the substrate, each of the organic light-emitting elements having, on the substrate in mentioned order, a first electrode patterned for each of the organic light-emitting elements, an organic compound layer patterned for each of the organic light-emitting elements, and a second electrode patterned for each of the organic light-emitting elements;
an element isolation layer formed across a space of a plurality of first electrodes to cover ends of the first electrodes, and having an opening at a portion of each of the organic light-emitting elements;
an inorganic sealing layer formed on the second electrode and the element isolation layer; and
a connection electrode formed on the inorganic sealing layer,
wherein:
the connection electrode is formed on the element isolation layer,
the connection electrode is in electrical contact with the second electrode through a contact hole provided in the inorganic sealing layer,
the element isolation layer and the inorganic sealing layer are in contact with each other,
at least a portion of the element isolation layer in contact with the organic compound layer is formed of an inorganic material,
the second electrode and the inorganic sealing layer each comprise a light transmissive member, and
the connection electrode comprises a light transmissive member continuously formed across a space with the plurality of organic light-emitting elements.

* * * * *